(12) United States Patent
Ulmer et al.

(10) Patent No.: US 9,093,475 B2
(45) Date of Patent: Jul. 28, 2015

(54) THIN FILM TRANSISTOR SHORT CHANNEL PATTERNING BY SUBSTRATE SURFACE ENERGY MANIPULATION

(71) Applicants: Kurt Ulmer, Vancouver, WA (US); Kanan Puntambekar, Chicago, IL (US)

(72) Inventors: Kurt Ulmer, Vancouver, WA (US); Kanan Puntambekar, Chicago, IL (US)

(73) Assignee: Sharp Laboratories of America, Inc, Camas, WA (US)

( * ) Notice: Subject to any disclaimer, the term of this patent is extended or adjusted under 35 U.S.C. 154(b) by 214 days.

(21) Appl. No.: 13/733,196

(22) Filed: Jan. 3, 2013

(65) Prior Publication Data

US 2014/0183634 A1    Jul. 3, 2014

Related U.S. Application Data

(63) Continuation-in-part of application No. 13/432,855, filed on Mar. 28, 2012, now Pat. No. 8,765,224, and a continuation-in-part of application No. 13/471,799, filed on May 15, 2012, now Pat. No. 8,796,083.

(51) Int. Cl.

| | |
|---|---|
| H01L 21/20 | (2006.01) |
| H01L 29/66 | (2006.01) |
| H01L 21/768 | (2006.01) |
| H01L 29/786 | (2006.01) |
| H01L 29/417 | (2006.01) |
| H01L 29/45 | (2006.01) |
| H01L 27/12 | (2006.01) |
| H01L 51/00 | (2006.01) |
| H01L 21/288 | (2006.01) |

(52) U.S. Cl.
CPC ......... *H01L 29/66742* (2013.01); *H01L 21/768* (2013.01); *H01L 27/1292* (2013.01); *H01L 29/41733* (2013.01); *H01L 29/45* (2013.01); *H01L 29/458* (2013.01); *H01L 29/66757* (2013.01); *H01L 29/786* (2013.01); *H01L 29/78696* (2013.01); *H01L 51/0022* (2013.01); *H01L 21/288* (2013.01)

(58) Field of Classification Search
USPC .......... 438/584, 151, 674, 598, 688; 257/288, 257/347, 390
See application file for complete search history.

(56) References Cited

U.S. PATENT DOCUMENTS

| | | | |
|---|---|---|---|
| 6,838,361 B2 * | 1/2005 | Takeo | 438/493 |
| 7,244,669 B2 * | 7/2007 | Sirringhaus et al. | 438/535 |
| 7,365,022 B2 | 4/2008 | Wong et al. | |

(Continued)

FOREIGN PATENT DOCUMENTS

| | | |
|---|---|---|
| EP | 1811331 | 7/2007 |
| GB | 2455747 | 6/2009 |

*Primary Examiner* — Jamie C Niesz
(74) *Attorney, Agent, or Firm* — Law Office of Gerald Maliszewski; Gerald Maliszewski

(57) ABSTRACT

A method is provided for forming a printed top gate thin film transistor (TFT) with a short channel length. The method provides a substrate with a low surface energy top surface. A metal ink line is continuously printed across a region of the substrate top surface, and in response to the surface tension of the printed metal ink, discrete spherical ink caps are formed in the region. Then, the surface energy of the substrate top surface in the region is increased. A source metal ink line is printed overlying a source spherical ink cap contact, and a drain metal ink line, parallel to the source metal ink line, is printed overlying a drain spherical ink cap contact. After depositing a semiconductor film, a channel is formed in the semiconductor film between the source and drain spherical ink cap contacts having a channel length equal to the first distance.

14 Claims, 7 Drawing Sheets

(56) References Cited

U.S. PATENT DOCUMENTS

| | | | |
|---|---|---|---|
| 7,635,889 B2* | 12/2009 | Isa et al. | 257/309 |
| 7,709,306 B2* | 5/2010 | Sirringhaus et al. | 438/151 |
| 7,749,916 B2 | 7/2010 | Wong et al. | |
| 7,935,565 B2* | 5/2011 | Brown et al. | 438/99 |
| 2004/0253835 A1* | 12/2004 | Kawase | 438/780 |
| 2013/0307073 A1* | 11/2013 | Ulmer et al. | 257/347 |

* cited by examiner

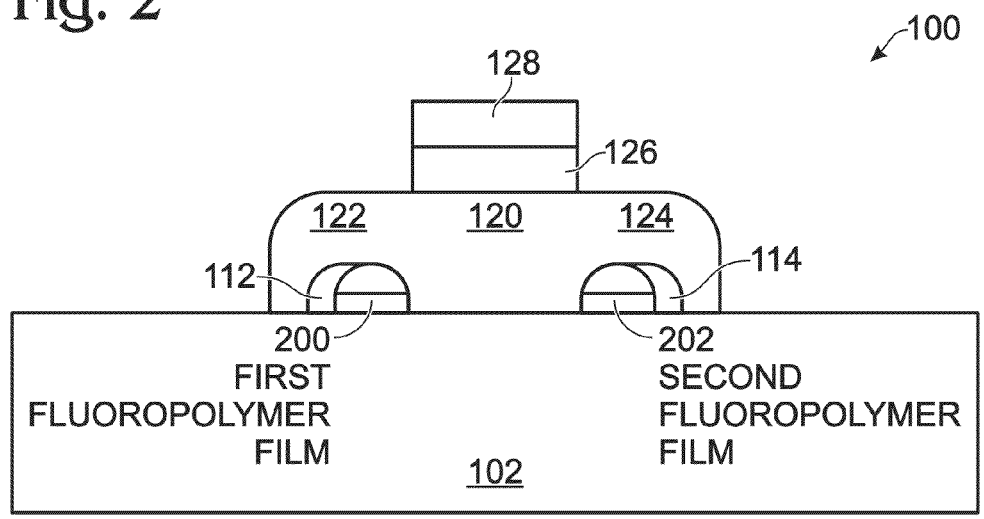
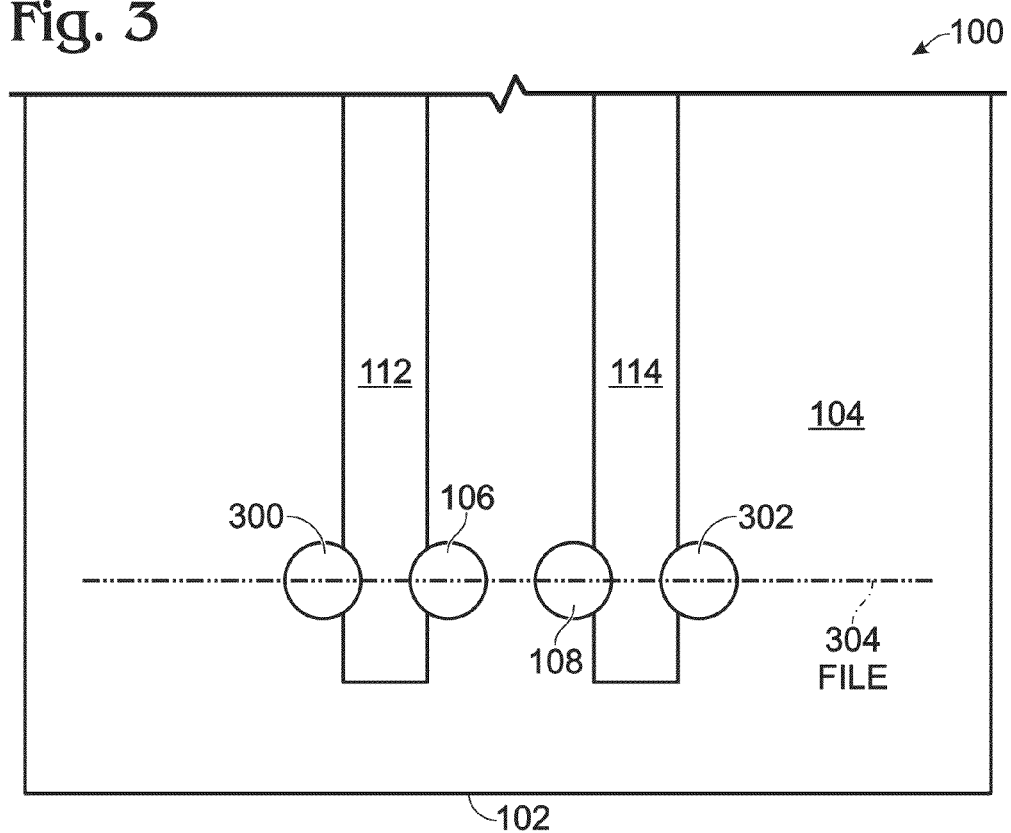

Fig. 8A
Fig. 8B
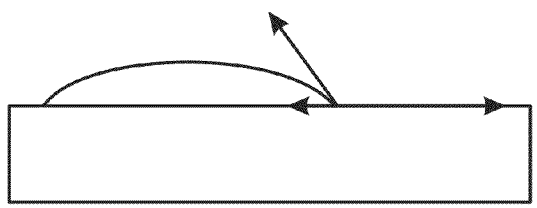
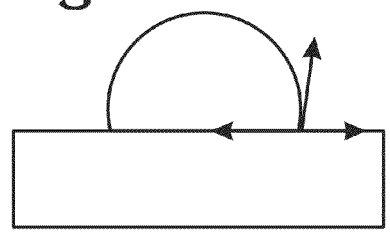
Fig. 9
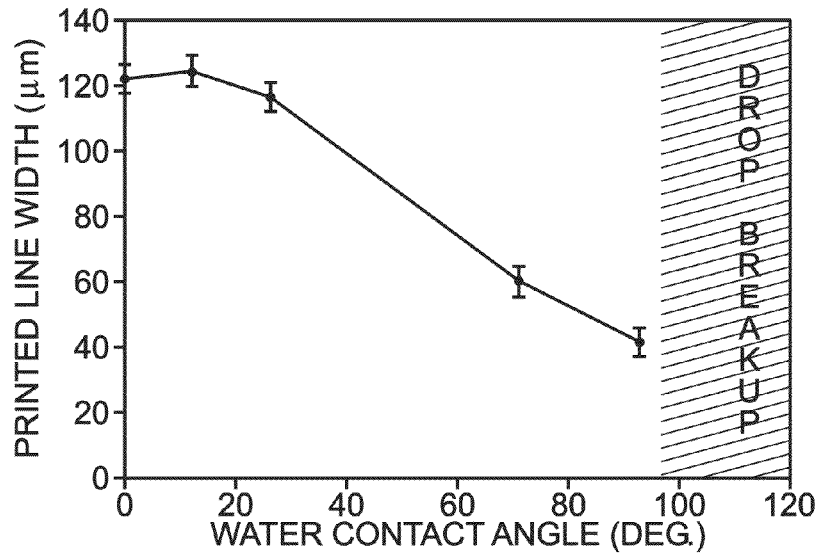
Fig. 10
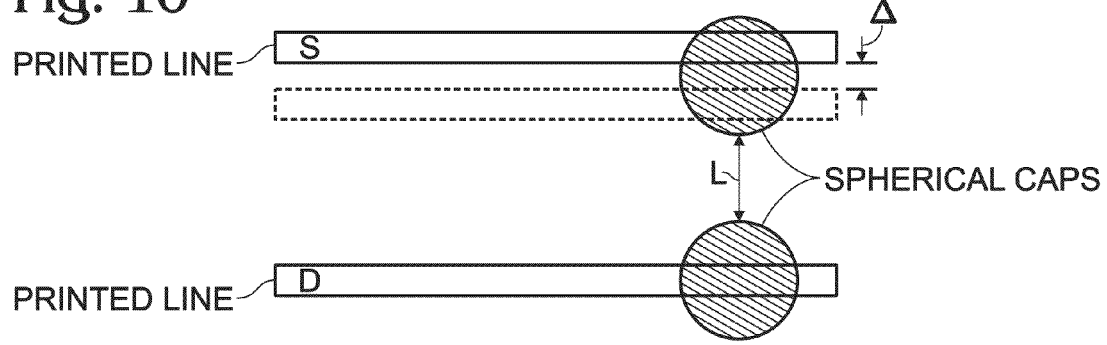

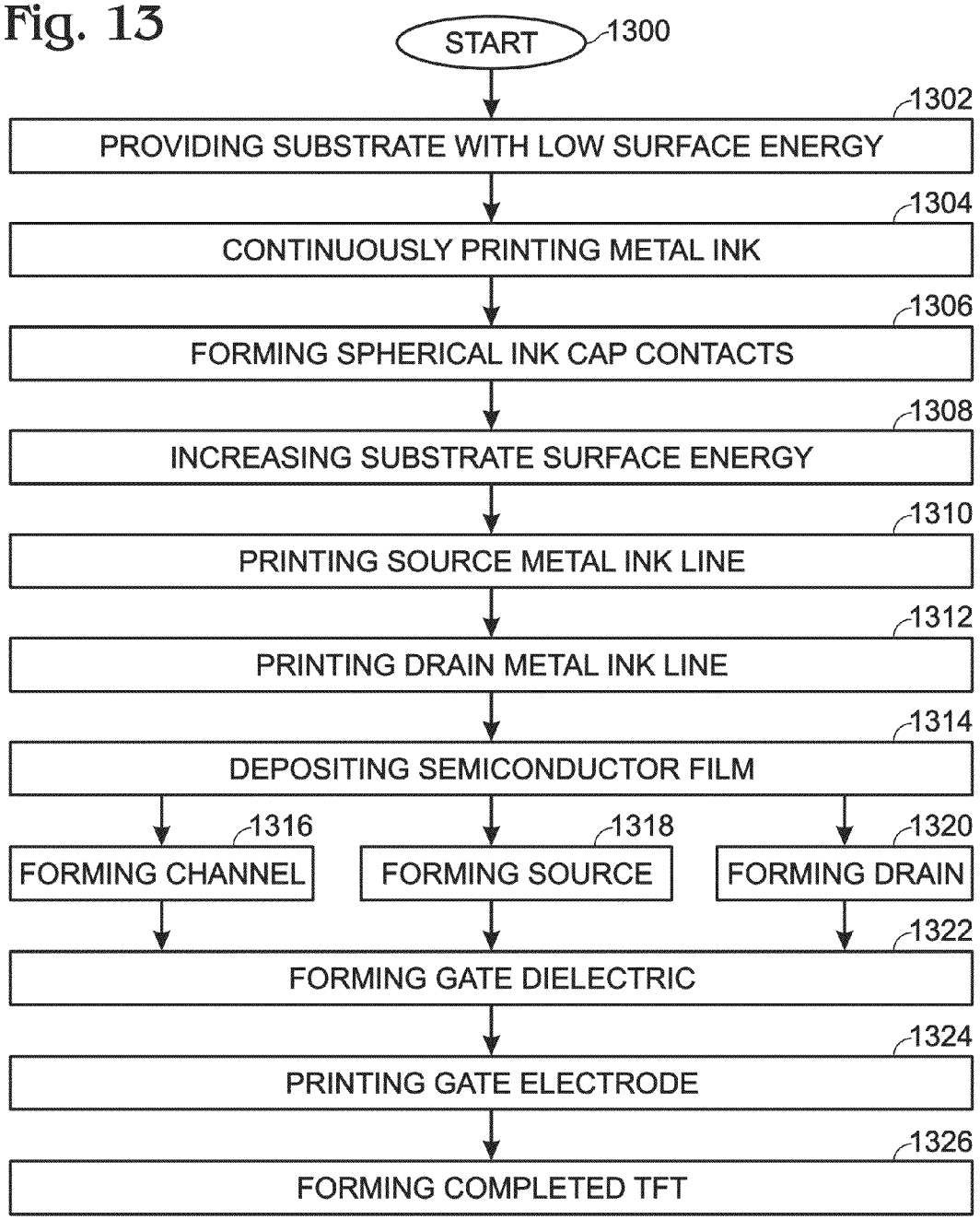

THIN FILM TRANSISTOR SHORT CHANNEL PATTERNING BY SUBSTRATE SURFACE ENERGY MANIPULATION

RELATED APPLICATIONS

This application is a continuation-in-part of a patent application entitled, CONTROLLING PRINTED INK LINE WIDTHS USING FLUOROPOLYMER TEMPLATES, invented by Kurt Ulmer et al., Ser. No. 13/432,855, filed. Mar. 28, 2012, which is incorporated herein by reference.

This application is a continuation-in-part of a patent application entitled, FLUOROPOLYMER MASK FOR TRANSISTOR CHANNEL DEFINITION, invented by Kurt Ulmer et al., Ser. No. 13/471,799, filed May 15, 2012 which is incorporated herein by reference.

BACKGROUND OF THE INVENTION

1. Field of the Invention

This invention generally relates to integrated circuit (IC) fabrication and, more particularly, to forming a printed transistor with a short channel length that is sub-resolutional to the movement of the printing equipment.

2. Description of the Related Art

As noted in Wikipedia, printed electronics is a set of prigting methods used to create electrical devices on various substrates. Printing typically uses common printing equipment or other low-cost equipment suitable for defining patterns on material, such as screen printing, flexography, gravure, offset lithography and inkjet. Electrically functional electronic or optical inks are deposited on the substrate, creating for example, active or passive devices, such as thin film transistors (TFTs) or resistors. These processes can utilize any liquid phase material, including, but not limited to, solutions, mixtures, and dispersions containing organic semiconductors, inorganic semiconductors, organic dielectrics, inorganic dielectrics, metallic conductors, oxide conductors, organic conductors, nanowires, nanoparticles, nanotubes, and nanotubes.

The attraction of printing technology for the fabrication of electronics mainly results from the possibility of preparing stacks of micro-structured layers (and thereby thin-film devices) over large areas in a much simpler and cost-effective way, as compared to conventional electronics. Also, the ability to implement new or improved functionalities (e.g. mechanical flexibility) plays a role.

Organic field-effect transistors and integrated circuits can be prepared completely by means of mass-printing methods. The selection of print methods for the different layers is determined by dimensional requirements and the properties of printed materials, as well as economic and technical considerations of the final printed products. Optimal resolution of these considerations typically results in a combination of several print methods for the fabrications of the devices, as opposed to a single method.

Inkjets are flexible and versatile, and can be set up with relatively little effort. Inkjets are currently the most commonly used method for the preparation of printed electronics. Inkjet printing is well suited for low-viscosity, soluble materials like organic semiconductors, and has proved useful in printing dispersed particles, like inorganic metal inks, with some observed difficulties due to nozzle clogging. Because ink is deposited via droplets, thickness and dispersion homogeneity is reduced. Inkjet printing is preferable for organic semiconductors in organic field-effect transistors (OFETs) and organic light-emitting diodes (OLEDs) due to viscosity constraints and high ink costs, but also OFETs completely prepared by this method have been demonstrated. Frontplanes and backplanes of OLED-displays, integrated circuits, organic photovoltaic cells (OPVCs), and other devices can be prepared with ink jets.

As mentioned above, both organic and inorganic materials are commonly used for printed electronics. These ink materials must be available in liquid form, for solution, dispersion, or suspension. Additionally, they have varying functionality, to serve as conductors, semiconductors, dielectrics, or insulators. Electronic functionality and printability can interfere with each other, mandating careful optimization. For example, a higher molecular weight in polymers enhances conductivity, but diminishes solubility. For printing, viscosity, surface tension, and solid content must be tightly controlled. Cross-layer interactions such as wetting, adhesion, and solubility as well as post-deposition drying procedures affect the outcome. Additives often used in conventional printing inks are unavailable, because they often defeat electronic functionality.

Metal inks are also commonly used in printed electronics for reasons of improved conductivity and potential for surface functionality, as compared to their organic counterparts. Silver, gold, and copper nanoparticle inks are used with all of the printing processes described above. Metal lines are commonly formed in printed electronic applications by inkjet printing of metal nanoparticle or metal precursor inks onto a substrate. The line width and line shape are dictated by the printed volume of ink and the interaction of the ink with the surface of the substrate. It is important to tailor the surface energy of the substrate for a specific ink to achieve the desired line characteristics. In order to create a thin film transistor (TFT) by inkjet printing, two inkjet printed metal layers are typically required: gate metal and source/drain metal. The source/drain print characteristics are of particular interest because they typically determine the transistor channel length (L).

The accuracy of inkjet drop placement limits how far down the channel length can be reasonably scaled, while preserving device yield. Misplaced drops can cause the printed source and drain lines to merge for example and cause an electrical short. There are many factors that affect drop placement. Some of these factors are hardware limitations of the printer. A couple examples of hardware limitations are the inherent accuracy of the substrate stage movement or movement of the inkjet cartridge. Typically, these positional limitations are on the order of 10 μm for commercially available printers today. The repeatable printing of lines with spacings below these values is unlikely without other process improvements.

TFT drain current is generally considered to be inversely proportional to the channel length of the device. So in order to improve the ON current and switching speed, the semiconductor performance must be enhanced (e.g., greater electron mobility) or the channel length reduced. This improvement becomes even more important in the case of display backplanes where the desire is to minimize the footprint of the backplane circuits. With a digital fabrication technique such as inkjet printing, the channel length of a printed device is determined by how close two adjacent electrode lines can be printed without the lines merging along their lengths. The drop placement and stage movement limitations of commercially available inkjet printers are on theoretically the order of 5 to 10 microns (μm), and practically, the inkjet printing of source/drain electrodes for TFTs with channel lengths below 30 μm is difficult to produce, and is not reproducible with current commercially available inkjet printers and ink formulations.

It would be advantageous if the above-mentioned printer hardware limitations could be circumvented with a process that reduced the spacing between printed features.

SUMMARY OF THE INVENTION

Disclosed herein is a series of process steps that enable the creation of thin film transistors (TFTs) with channel lengths below those that are typically patterned by inkjet printing, while still utilizing the same commercially available inkjet printing hardware. The methodology takes advantage of the drop breakup behavior of metal inks on low surface energy substrates to form short channel top gate TFT devices. More explicitly, short channel length TFT structures can be created by taking advantage of the drop breakup behavior of a silver nanoparticle ink on a surface with a low surface energy such as a fluoropolymer. Channel lengths can be made well below the 10 μm alignment limitations of commercially available inkjet printers. A silver line is printed onto a fluoropolymer surface, and based on the ink volume, surface tension of the ink, and surface energy of the substrate, a very precisely controlled pattern of silver ink spherical caps forms on the substrate with reproducible size and spacing. After annealing and further processing, as described in more detail below, the substrate surface energy can be increased enough so that continuous contact lines can be printed to complete a useable source/drain structure for a TFT device.

Accordingly, a method is provided for forming a printed top gate TFT with a channel length that is sub-resolutional with respect to printing equipment movements. The method provides a substrate with a low surface energy top surface. A metal ink line is continuously printed across a region of the substrate top surface, and in response to the surface tension of the printed metal ink, discrete spherical ink caps are formed in the region. In particular, a source spherical ink cap contact is formed adjacent to a drain spherical ink cap contact, separated by a first distance. The printed metal spherical ink caps are transformed to a solid form by application of thermal, electromagnetic, or photonic energy. The selection of curing method is determined by the metal ink formulation. Then, the surface energy of the substrate top surface in the region is increased, in one aspect, providing the substrate with the low surface energy top surface includes forming a fluoropolymer film overlying the substrate. Then, increasing the surface energy of the substrate top surface includes exposing the fluoropolymer film region to a forming gas radio frequency (RF) plasma.

A source metal ink line is printed overlying the source spherical ink cap contact, and a drain metal ink line, parallel to the source metal ink line, is printed overlying the drain spherical ink cap contact. After depositing a semiconductor film overlying the region, a channel is formed in the semiconductor film between the source and drain spherical ink cap contacts having a channel length equal to the first distance. A source is formed in the semiconductor film overlying the source spherical ink cap contact, and a drain is formed in the semiconductor film overlying the drain spherical ink cap contact. A gate dielectric is formed overlying the channel, and a gate electrode is printed over the gate dielectric to form a completed TFT.

Additional details of the above-described method, and a printed top gate thin film transistor with a channel length that is sub-resolutional with respect to printing equipment movements, are provided below.

BRIEF DESCRIPTION OF THE DRAWINGS

FIG. 2 is a partial cross-sectional view showing a first variation of the TFT of FIGS. 1A and 1B.

FIG. 3 is a plan view depicting a second variation of the TFT of FIGS. 1A and 1B.

FIGS. 8A and 8B respectively depict the spread of ink on a substrate with high and low surface energy.

FIG. 9 is a graph depicting the relationship of printed silver ink line width to measured substrate surface water contact angle.

FIG. 10 is a plan view depicting printing alignment fault tolerant device architecture.

FIG. 13 is a flowchart illustrating a method for forming a printed top gate TFT with a channel length that is sub-resolutional with respect to printing equipment movements.

DETAILED DESCRIPTION

Figure 1A:
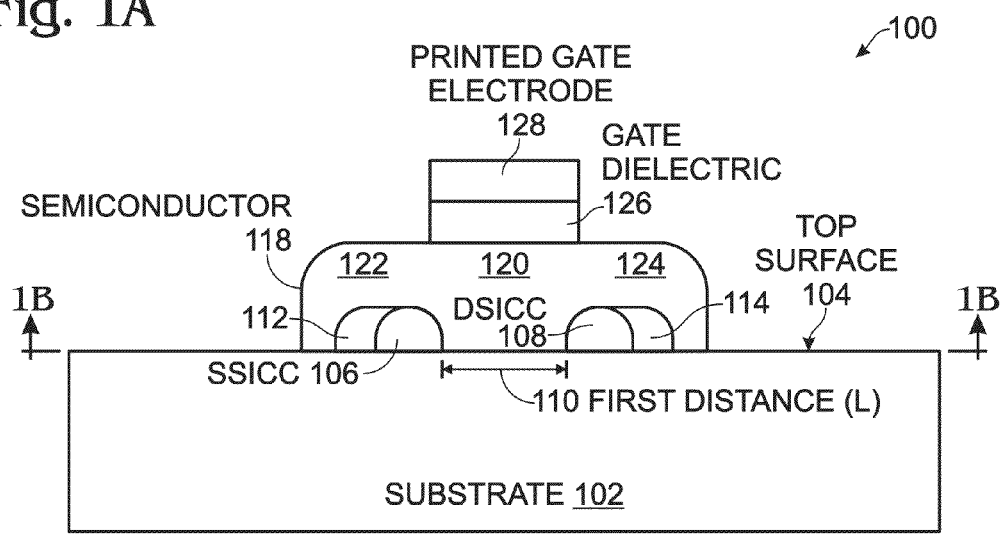
FIGS. 1A and 1B are, respectively, partial cross-sectional and plan views of a printed top gate thin film transistor (TFT) with a channel length that is sub-resolutional with respect to printing equipment movements.
Figure 1B:
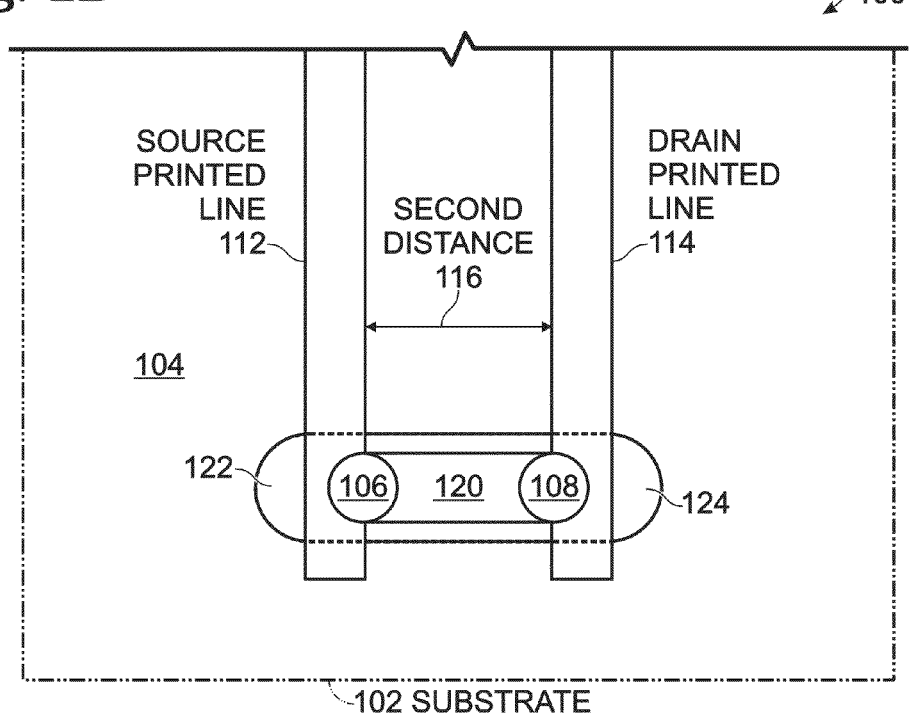

FIGS. 1A and 1B are, respectively, partial cross-sectional and plan views of a printed top gate thin film transistor (TFT) with a channel length that is sub-resolutional with respect to printing equipment movements. The TFT 100 comprises a substrate 102 with a top surface 104. The substrate may be glass, plastic, or a semiconductor material. A source spherical ink cap contact 106 (SSICC) overlies the substrate top surface 104 and a drain spherical ink cap contact (DSICC) 108 overlies the substrate top surface. The DSICC 108 is adjacent to the source spherical ink cap contact 106, separated by a first distance 110. A printed source metal ink line 112 overlies the source spherical ink cap contact 106. A printed drain metal ink line 114, parallel to the source metal ink line 112, overlies the drain spherical ink cap contact 108. Adjacent edges of the source metal ink line 112 and the drain metal ink line 114 are separated by a second distance 116. As can be seen from the figure, the lines 112/114 need not completely cover the contacts 106/108. In fact, as explained in more detail below, the contacts 106/108 can be formed closer to each other than can the conventionally printed lines 112/114. That is, the printed source and printed drain metal ink lines 112/114 are separated by a second distance 116 equal to a minimum printing distance between lines. The metal in the contacts and lines is not limited to any particular material, but silver (Ag) is a commonly used metal for this purpose, it should also be noted that the channel 120 has a characteristic shape that is unique, in that it is formed with "U"-shaped indentations between spherically shaped electrodes 106 and 108.

A semiconductor film 118 overlies the spherical ink cap contacts 106/108 and the printed metal ink lines 112/114. The semiconductor film 118 is not limited to any particular material, however, silicon (Si), germanium (Ge), silicon-germanium (SiGe), and organic conducting polymers such as poly (3,4-ethylene dioxitiophene), doped with poly(styrene sulfonate), (PEDOT:PSS) and poly(aniline) (PANI) may be used. The semiconductor film 118 comprises a channel 120 between (in-plane) the source spherical ink cap contact 106 and the drain spherical ink cap contact 108, having a channel length (L) equal to the first distance 110. A source 122 overlies the source spherical ink cap contact 106 and a drain 124 overlies the drain spherical ink cap contact 108. The channel 120, source, 122, and drain 124 are formed in the same (horizontal) plane. A gate dielectric 126 overlies the channel 122, and a printed gate electrode 128 overlies the gate dielectric 126.

FIG. 2 is a partial cross-sectional view showing a first variation of the TFT of FIGS. 1A and 1B. In this aspect a first fluoropolymer film 200 is interposed between the source spherical ink cap contact 106 and the substrate top surface 104. A second fluoropolymer film 202 is interposed between the drain spherical ink cap contact 108 and the substrate top surface 104. As explained in more detail below, the fluoropolymer films are left as a result of process that lowers the substrate surface energy.

FIG. 3 is a plan view depicting a second variation of the TFT of FIGS. 1A and 1B. In this aspect, the spherical ink cap contacts are formed in a file 304 with an auxiliary source spherical ink cap contact 300 adjacent to the source spherical ink cap contact 106, the drain spherical ink cap contact 108 adjacent to the source spherical ink cap contact 106, and an auxiliary drain spherical ink cap contact 302 adjacent to the drain spherical ink cap contact 108. The printed source metal ink line 112 at least partially overlies both the source spherical ink cap contact 106 and the auxiliary source spherical ink cap contact 300. The printed drain metal ink line 114 at least partially overlies both the drain spherical ink cap contact 108 and the auxiliary drain spherical ink cap contact 302.

Figure 4:
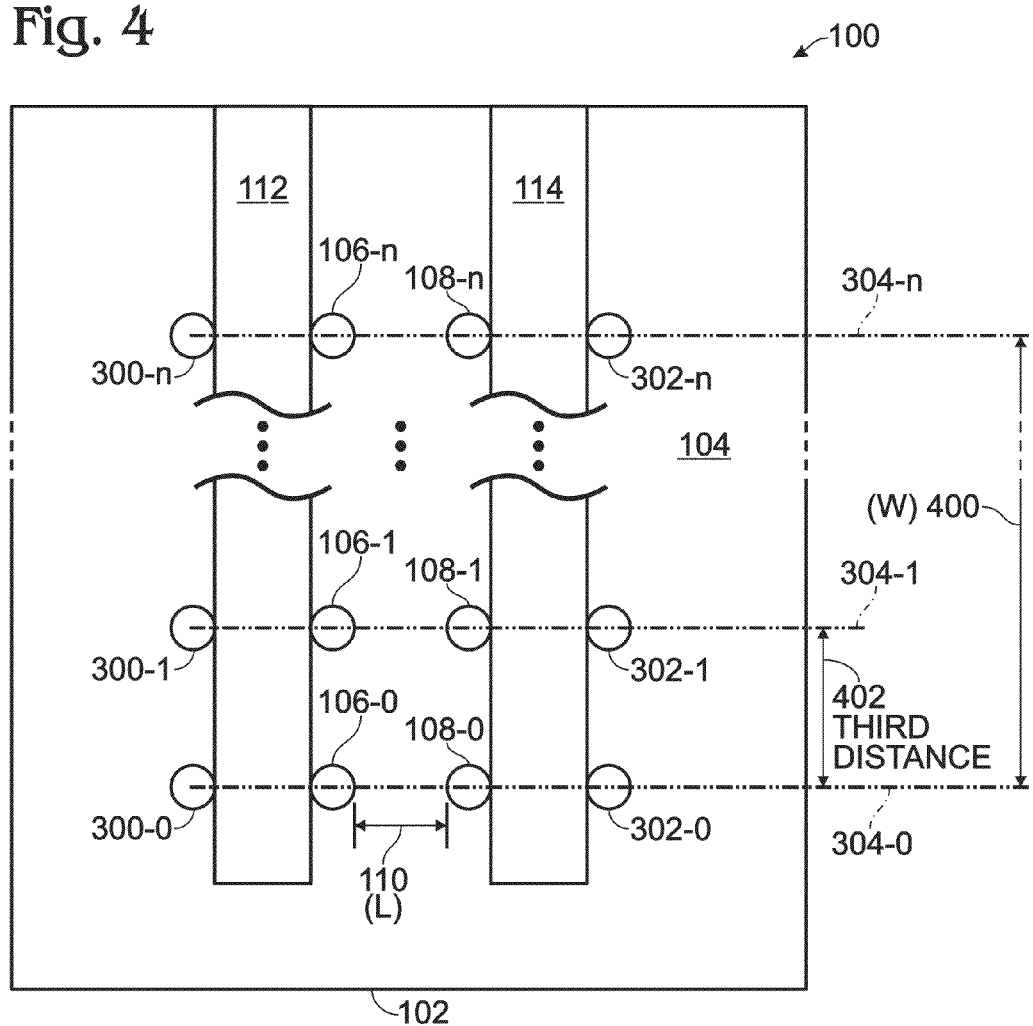
FIG. 4 is a plan view depicting a third variation of the TFT of FIGS. 1A and 1B.

FIG. 4 is a plan view depicting a third variation of the TFT of FIGS. 1A and 1B. In this aspect the spherical ink cap contacts are formed in a first plurality of adjacent files 304-0 through 304-n, where each file 304 includes a source spherical ink cap contact 106, auxiliary source spherical ink cap contact 300, drain spherical ink cap contact 108, and auxiliary drain spherical ink cap contact 302. The files are separated by a third distance 402. The printed source metal ink line 112 at least partially overlies both the source spherical ink cap contact 106 and the auxiliary source spherical ink cap contact 300 in each file 304. The printed drain metal ink line 114 at least partially overlies both the drain spherical ink cap contact 108 and the auxiliary drain spherical ink cap contact 302 in each file 304. Thus, the TFT 100 has a channel length (L) equal to the first distance 110 and a channel width (W) 400 equal to (n×the third distance 402).

Figure 5:
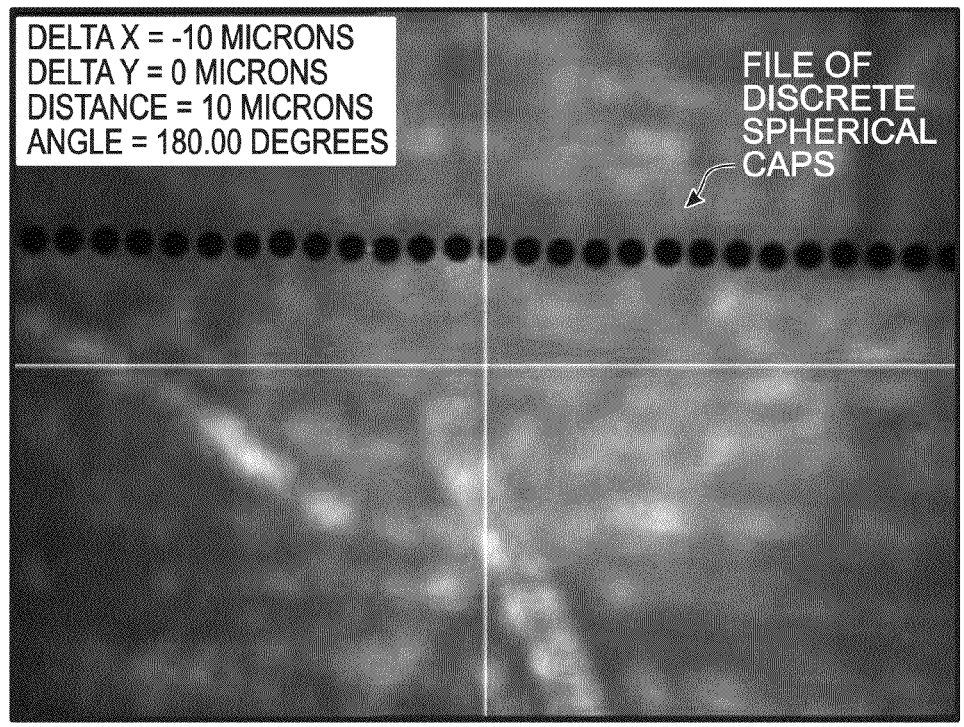
FIG. 5 is a plan view depicting a continuous printed line of silver nanoparticle ink that has broken up into discrete spherical caps of ink on a fluoropolymer surface.

FIG. 5 is a plan view depicting a continuous printed line of silver nanoparticle ink that has broken up into discrete spherical caps of ink on a fluoropolymer surface. In the case of a fluoropolymer coated substrate with low surface energy, the surface tension of the ink is great enough that a continuous printed line of ink breaks into discrete islands of ink. This behavior is used to support the patterning process described herein. The size of the spherical caps and the spacing between adjacent spherical caps is observed to be uniform, and adjacent spherical caps can be used as source/drain electrodes, with the spacing between them forming the channel area of a TFT.

Figure 6:
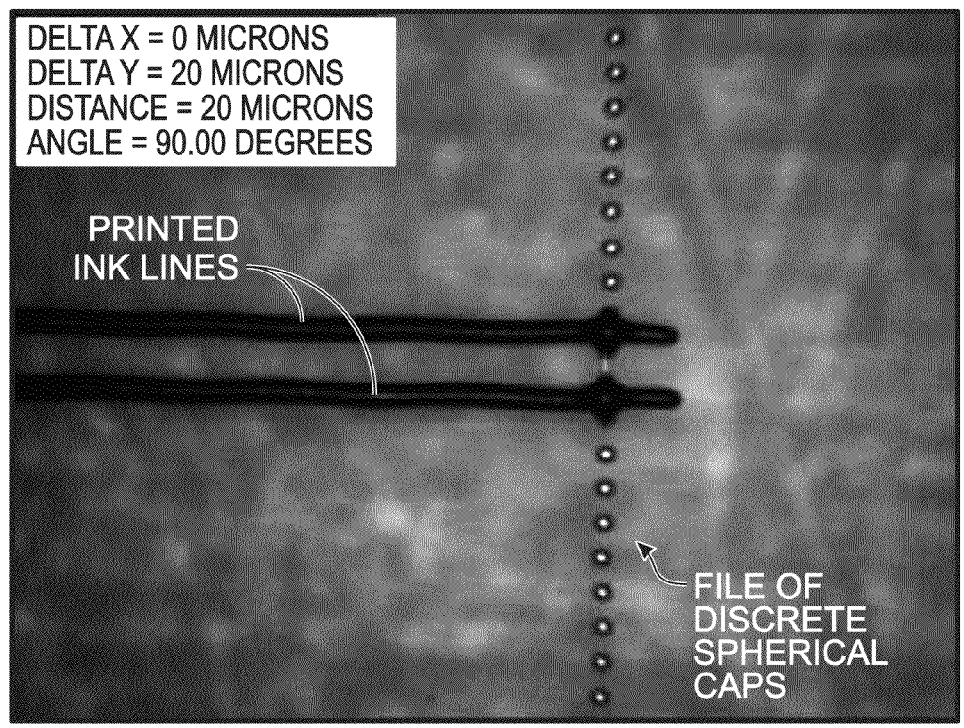
FIG. 6 is a plan view showing printed electrical connection lines, connected to two adjacent spherical caps that were previously printed on the low surface energy fluoropolymer surface (FIG. 5).

FIG. 6 is a plan view showing printed electrical connection lines, connected to two adjacent spherical caps that were previously printed on the low surface energy fluoropolymer surface (FIG. 5). A second step in this process is to alter the surface energy of the fluoropolymer substrate coating, such that continuous silver ink lines can be printed to form electrical contact lines in order to connect the printed TFTs to external circuitry. One means of altering the surface energy is to use a plasma surface treatment.

Figure 7:
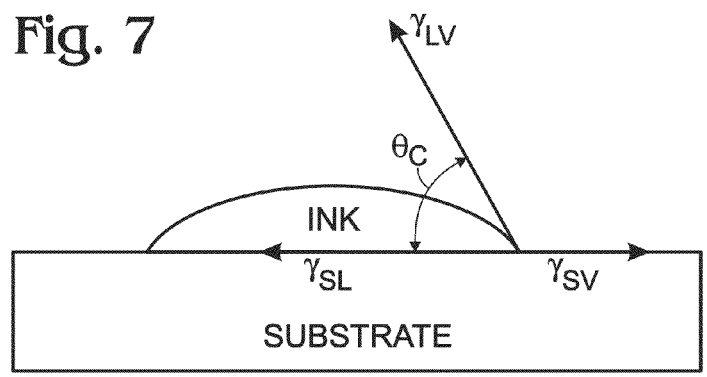
FIG. 7 depicts an ink drop formation on a substrate defined by the interaction of three interfaces.

FIG. 7 depicts an ink drop formation on a substrate defined by the interaction of three interfaces. The process steps demonstrated by FIGS. 5 and 6 support a method that utilizes the low surface energy of a fluoropolymer surface to pattern the short channel source and drain electrodes in an organic TFT. The formation of a droplet on a solid surface is governed by the relative values of energies of the solid surface, surface tension of the liquid drop, and the interface between the liquid and the solid surface. This behavior is described by Young's Equation:

$$\gamma_{LV}\cos\theta_c = \gamma_{SV} - \gamma_{SL}.$$

Where:
$\gamma_{LV}$, surface energy of the liquid droplet
$\gamma_{SV}$, surface energy of the substrate
$\gamma_{SL}$, surface energy of the substrate/liquid interface
$\theta_c$, contact angle FIGS. 8A and 8B respectively depict the spread of ink on a substrate with high and low surface energy. A substrate with a relatively large surface energy $\gamma_{SL}$ compared to the surface tension of the ink droplet $\gamma_{LV}$ manifests itself as a significant spread of the ink droplet on the substrate (FIG. 8A). A substrate with a small surface energy produces minimal ink droplet spread (FIG. 8B).

Thus, if a metal precursor ink is deposited by an additive method such as printing, onto a substrate having a low surface energy, the effect of the surface tension of the ink being greater than the substrate surface energy causes the printed ink line to break up into discrete spherical caps. To demonstrate this effect, a line of silver nanoparticle ink was inkjet printed with a printer onto a glass substrate treated with a fluoropolymer dielectric material. As shown in FIG. 5, the continuous printed line breaks up into a periodic structure of discrete spherical caps.

FIG. 9 is a graph depicting the relationship of printed silver ink line width to measured substrate surface water contact angle. The behavior of ink is further predicted by measuring the printed line width as a function of water contact angle. The water contact angle is measured by placing a drop of water on a substrate. The angle that a line tangent to the drop makes with the plane of the substrate is the water contact angle. Generally, the water contact increases as the surface energy decreases. For example, the water contact angle for one commercially available fluoropolymer with a low surface energy is measured to be 117°. Using this same fluoropolymer material, it is observed that surfaces with measured water contact angle nominally greater than 93' exhibit the drop breakup of the silver nanoparticle ink. This behavior is of interest as it determines the channel length of the resulting TFT structure. Using this particular fluoropolymer material, continuous metal ink lines can be printed on surfaces exhibiting water contact angles nominally less than 93'. The results of the graph are summarized in Table 1.

TABLE 1

| Water contact angle, ° | Line width, μm |
| --- | --- |
| 0 | 122 |
| 12 | 124 |

TABLE 1-continued

| Water contact angle, ° | Line width, μm |
|---|---|
| 26 | 117 |
| 71 | 60 |
| 93 | 41 |
| 117 | — |

Once this first printed silver layer is thermally annealed to permanently fix the discrete spherical caps in place, a plasma surface treatment is conducted on the substrate in order to increase the substrate surface energy. For this process, the substrate is exposed to forming gas (4% $H_2$ in $N_2$) RF plasma. By application of this surface treatment, the water contact angle of the exemplary fluoropolymer dielectric can be decreased from 117° to 90°. A water contact angle of 90° in this example is sufficiently low enough that continuous printed silver contact lines can be printed to make electrical contact to the short channel TFT structure.

FIG. 10 is a plan view depicting printing alignment fault tolerant device architecture. By applying the advantages of above-described surface energy processes, the placement accuracy of the source/drain contact lines becomes less challenging for the printing hardware. Since the channel dimensions are set by the drop (spherical cap) breakup in the first print, the contact lines play no role in defining the channel length, and thus, the relative placement accuracy requirements become less rigid.

Figure 11:
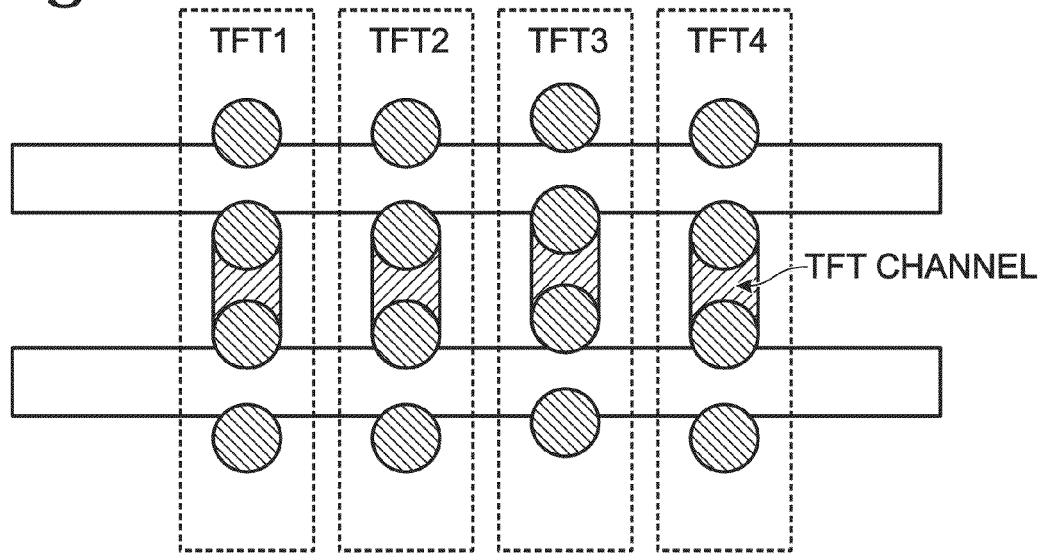
FIG. 11 is a plan view depicting how channel width can be increased by connecting several spherical caps to form TFT source/drain contacts.

FIG. 11 is a plan view depicting how channel width can be increased by connecting several spherical caps to form TFT source/drain contacts. The four parallel devices essentially for a single TFT with a common source and drain.

In summary, a short channel TFT structure fabrication process has been demonstrated. By using the drop breakup behavior of metal nanoparticle inks on low surface energy substrates, small channel length values can be achieved. These TFT devices have channel widths similar to the channel lengths, but the channel width can be increased by using multiple rows of spherical caps printed in the first print step, that are subsequently connected by contact lines printed in the second print step. This process has the further advantage of reducing alignment tolerance concerns.

In general, the process flow for forming short channel top gate source/drain features by surface energy manipulation is as follows:
  Clean substrate;
  Coat substrate with fluoropolymer coating or other low surface energy coating;
  Print line of silver nanoparticle ink (breaks up into discrete spherical caps), thermal anneal;
  Surface plasma treat low surface energy coating (e.g., $H_2/N_2$, 40 watts, 10 seconds); and,
  Rotate substrate 90°, Print silver source/drain contact lines, thermal anneal.

Figure 12:
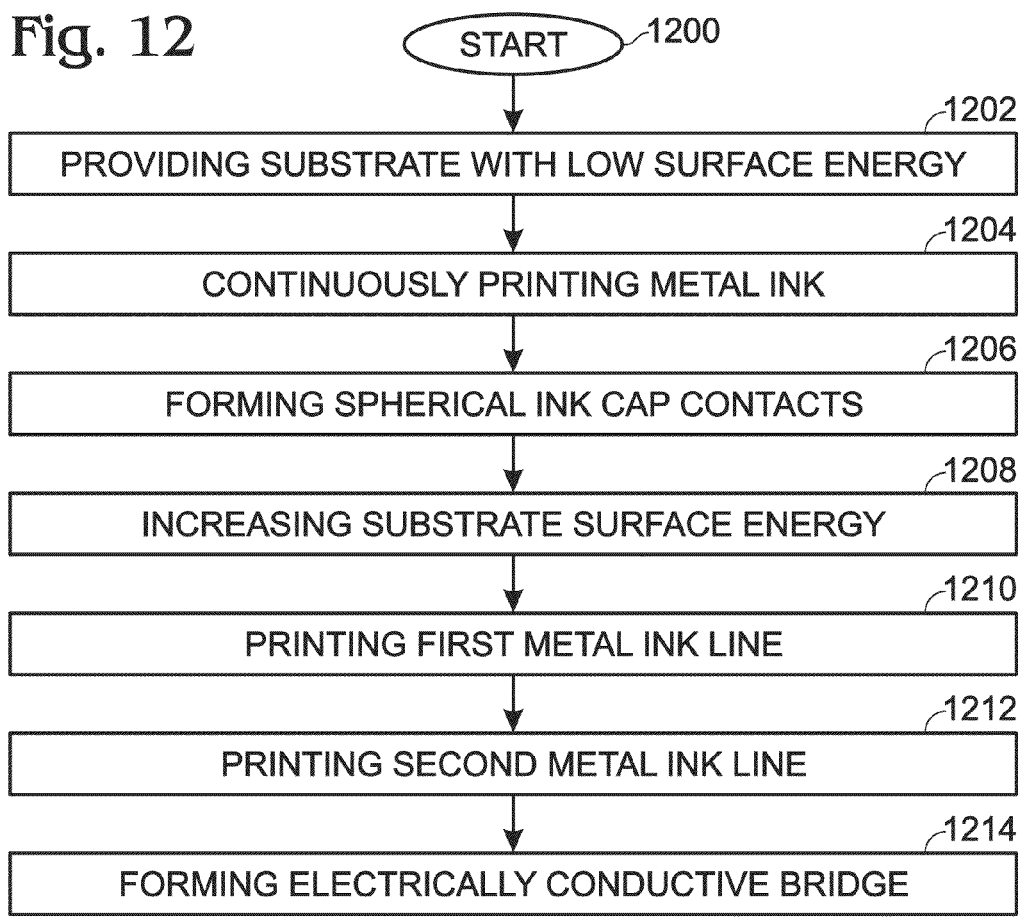
FIG. 12 is a flowchart illustrating a method for controlling the spacing of an electrical connection between printed ink metal lines.

FIG. 12 is a flowchart illustrating a method for controlling the spacing of an electrical connection between printed ink metal lines. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1200.

Step 1202 provides a substrate with a low surface energy top surface. Step 1204 continuously prints metal ink across a region of the substrate top surface. In response to a surface tension of the printed metal ink, Step 1206 forms discrete spherical ink caps in the region, including a first spherical ink cap contact adjacent to a second spherical ink cap contact, separated by a first distance. Step 1208 increases the surface energy of the substrate top surface in the region. Step 1210 prints a first metal ink line overlying the first spherical ink cap contact. Step 1212 prints a second metal ink line, parallel to the first metal ink line, overlying the second spherical ink cap contact. Adjacent edges of the first and second metal ink lines are separated by a second distance. In one aspect, the second distance is equal to a minimum movement of the printer device. The printer motion may be responsive to moving a printer cartridge over a fixed substrate stage, or moving the substrate stage with respect to the printer cartridge. Step 1214 forms an electrically conductive bridge between the first and second metal ink lines having a length equal to the first distance.

In one aspect, forming the spherical ink caps in Step 1206 includes forming the first and second spherical ink caps contacts separated by a predetermined first distance. As noted above, the first distance can be manipulated by controlling the substrate surface energy and surface tension associated with the ink. Forming the first and second metal ink lines in Steps 1210 and 1212 includes forming the first and second metal ink lines separated by a second distance with a non-predetermined printer device tolerance. Alternately stated, the alignment tolerances of the printed lines are less critical since the first distance is controllable.

In one aspect, providing the substrate with the low surface energy top surface in Step 1202 includes forming a fluoropolymer film overlying the substrate. Then, increasing the surface energy of the substrate top surface in Step 1208 includes exposing the fluoropolymer film region to a forming gas radio frequency (RF) plasma. That is, Step 1206 forms the discrete spherical ink caps on a fluoropolymer film associated with a first surface energy, and Step 1208 creates a second surface energy associated with the fluoropolymer film greater than the first surface energy. Alternatively, it may be possible to lower the surface energy of some substrates using a substrate treatment process that does not involve the deposition of an additional film layer.

FIG. 13 is a flowchart illustrating a method for forming a printed top gate TFT with a channel length that is sub-resolutional with respect to printing equipment movements. The method begins at Step 1300. Step 1302 provides a substrate with a low surface energy top surface. Step 1304 continuously prints metal ink across a region of the substrate top surface. In response to a surface tension of the printed metal ink, Step 1306 forms discrete spherical ink caps in the region, including a source spherical ink cap contact adjacent to a drain spherical ink cap contact, separated by a first distance. Although not shown as an explicit step following Step 1306, the printed metal spherical ink caps are transformed to a solid form by application of thermal, electromagnetic, or photonic energy. The selection of curing method is determined by the metal ink formulation. Step 1308 increases the surface energy of the substrate top surface in the region. Step 1310 prints a source metal ink line overlying the source spherical ink cap contact. Step 1312 prints a drain metal ink line, parallel to the source metal ink line, overlying the drain spherical ink cap contact. Adjacent edges of the source and drain metal ink lines are separated by a second distance. Although not shown, a metal ink curing step may be performed after Step 1312. Step 1314 deposits a semiconductor film overlying the region. For example, the semiconductor may be deposited by spin coating or ink jet printing, followed by a thermal treatment.

Step 1316 forms a channel in the semiconductor film between the source and drain spherical ink cap contacts having a channel length equal to the first distance. Step 1318 forms a source in the semiconductor film overlying the source spherical ink cap contact. Step 1320 forms a drain in the semiconductor film overlying the drain spherical ink cap contact. Step 1322 forms a gate dielectric overlying the channel. For example, the dielectric may be deposited by spin coating or ink jet printing, followed by a thermal treatment. Step 1324 prints a gate electrode overlying the gate dielectric. Although not explicitly shown, a metal ink curing process may follow Step 1324. Step 1326 forms a completed TFT.

In one aspect, forming the spherical ink caps in Step 1306 includes forming the source and drain spherical ink caps contacts separated by a predetermined first distance, and forming the source and drain metal ink lines in Steps 1310 and 1312 includes forming the source and drain metal ink lines separated by a second distance with a non-predetermined printer device tolerance. in another aspect, the second distance is equal to the minimum (stage anti/or ink cartridge) movement of the printer device.

In one aspect, providing the substrate with the low surface energy top surface in Step 1302 includes forming a fluoropolymer film overlying the substrate. Then, increasing the surface energy of the substrate top surface in Step 1308 includes exposing the fluoropolymer film region to a forming gas RF plasma. Alternatively stated, Step 1306 forms the discrete spherical ink caps on a fluoropolymer film associated with a first surface energy, and Step 1308 creates a second surface energy associated with the fluoropolymer film greater than the first surface energy.

In another aspect, continuously printing metal ink (Step 1304) to form discrete spherical ink caps (Step 1306) includes printing the metal ink in a first direction across the substrate top surface. Then, printing the source and drain metal ink lines in Steps 1310 and 1312 includes, in a continuous in situ process, rotating the substrate 90° and printing the source and drain metal ink lines in a second direction, orthogonal to the first direction, see FIGS. 5 and 6.

In one aspect, forming the source spherical ink cap contact adjacent to a drain spherical ink cap contact in Step 1306 includes forming spherical ink cap contacts in a file with an auxiliary source spherical ink cap contact adjacent to the source spherical ink cap contact, the drain spherical ink cap contact adjacent to the source spherical ink cap contact, and an auxiliary drain spherical ink cap contact adjacent to the drain spherical ink cap contact. Then, printing the source metal ink line in Step 1310 includes printing the source metal ink line at least partially overlying both the source and auxiliary source spherical ink cap contacts. Printing the drain metal ink line in Step 1312 includes printing the drain metal ink line at least partially overlying both the drain and auxiliary drain spherical ink cap contacts, see FIG. 3.

In another aspect, continuously printing metal ink across the region of the substrate top surface in Step 1304 includes printing in a first plurality of adjacent iterations separated by a third distance. Then, forming the spherical ink cap contacts in the file (Step 1306) includes forming a first plurality of adjacent files, where each file includes a source, auxiliary source, drain, and auxiliary drain spherical ink cap contact. Step 1310 prints the source metal ink line at least partially overlying both the source and auxiliary source spherical ink cap contacts in each file. Step 1312 prints the drain metal ink line at least partially overlying both the drain and auxiliary drain spherical ink cap contacts in each file, see FIG. 4. If Step 1306 forms the spherical ink cap contacts into n files, then the completed TFT of Step 1326 has a channel length equal to the first distance and a channel width equal to (n×the third distance).

Provided are a method for controlling the spacing of an electrical connection between printed ink metal lines, a method for forming a short channel TFT, and a corresponding short channel TFT device. Examples of particular materials and process steps have been presented to illustrate the invention. However, the invention is not limited to merely these examples. Although top gate TFT devices have been described in detail, the invention is applicable to other transistor topologies. Other variations and embodiments of the invention will occur to those skilled in the art.

We claim:

1. A method for controlling the spacing of an electrical connection between printed ink metal lines, the method comprising:
   providing a substrate with a low surface energy top surface;
   continuously printing metal ink across a region of the substrate top surface;
   in response to a surface tension of the printed metal ink, forming discrete spherical ink caps in the region, including a first spherical ink cap contact adjacent to a second spherical ink cap contact, separated by a first distance;
   increasing the surface energy of the substrate top surface in the region;
   printing a first metal ink line overlying the first spherical ink cap contact;
   printing a second metal ink line, parallel to the first metal ink line, overlying the second spherical ink cap contact, where adjacent edges of the first and second metal ink lines are separated by a second distance; and,
   forming an electrically conductive bridge between the first and second metal link lines having a length equal to the first distance.

2. The method of claim 1 wherein forming the spherical ink caps includes forming the first and second spherical ink cap contacts separated by a predetermined first distance; and,
   wherein forming the first and second metal ink lines includes forming the first and second metal ink lines separated by a second distance with a non-predetermined printer device tolerance.

3. The method of claim 1 wherein providing the substrate with the low surface energy top surface includes forming a fluoropolymer film overlying the substrate; and,
   wherein increasing the surface energy of the substrate top surface includes exposing the fluoropolymer film region to a forming gas radio frequency (RF) plasma.

4. The method of claim 3 wherein forming the discrete spherical ink caps in response to a surface tension of the printed metal ink includes forming the discrete spherical ink caps on the fluoropolymer film associated with a first surface energy; and,
   wherein exposing the fluoropolymer film to the forming gas RF plasma includes creating a second surface energy associated with the fluoropolymer film greater than the first surface energy.

5. The method of claim 1 wherein forming the first and second metal ink lines separated by the second distance includes the second distance being equal to a minimum movement of a printer device.

6. A method for forming a printed top gate thin film transistor (TFT) with a channel length that is sub-resolutional with respect to printing equipment movements, the method comprising:

providing a substrate with a low surface energy top surface;

continuously printing metal ink across a region of the substrate top surface;

in response to a surface tension of the printed metal ink, forming discrete spherical ink caps in the region, including a source spherical ink cap contact adjacent to a drain spherical ink cap contact, separated by a first distance;

increasing the surface energy of the substrate top surface in the region;

printing a source metal ink line overlying the source spherical ink cap contact;

printing a drain metal ink line, parallel to the source metal ink line, overlying the drain spherical ink cap contact, where adjacent edges of the source metal ink line and drain metal ink line are separated by a second distance;

depositing a semiconductor film overlying the region;

forming a channel in the semiconductor film between the source spherical ink cap contact and drain spherical ink cap contact having a channel length equal to the first distance;

forming a source in the semiconductor film overlying the source spherical ink cap contact;

forming a drain in the semiconductor film overlying the drain spherical ink cap contact;

forming a gate dielectric overlying the channel;

printing a gate electrode overlying the gate dielectric; and, forming a completed TFT.

7. The method of claim 6 wherein forming the spherical ink caps includes forming the source spherical ink cap contact and drain spherical ink cap contact separated by a predetermined first distance; and, wherein forming the source metal ink line and drain metal ink line includes forming the source metal ink line and drain metal ink line separated by a second distance with a non-predetermined printer device tolerance.

8. The method of claim 6 wherein providing the substrate with the low surface energy top surface includes forming a fluoropolymer film overlying the substrate; and, wherein increasing the surface energy of the substrate top surface includes exposing the fluoropolymer film region to a forming gas radio frequency (RF) plasma.

9. The method of claim 8 wherein forming the discrete spherical ink caps in response to a surface tension of the printed metal ink includes forming the discrete spherical ink caps on the fluoropolymer film associated with a first surface energy; and, wherein exposing the fluoropolymer film to the forming gas RF plasma includes creating a second surface energy associated with the fluoropolymer film greater than the first surface energy.

10. The method of claim 6 wherein continuously printing metal ink to form discrete spherical ink caps includes printing the metal ink in a first direction across the substrate top surface; and, wherein printing the source metal ink line and drain metal ink line includes, in a continuous in situ process, rotating the substrate 90° and printing the source metal ink line and drain metal ink line in a second direction, orthogonal to the first direction.

11. The method of claim 6 wherein forming the source spherical ink cap contact adjacent to a drain spherical ink cap contact includes forming spherical ink cap contacts in a file with an auxiliary source spherical ink cap contact adjacent to the source spherical ink cap contact, the drain spherical ink cap contact adjacent to the source spherical ink cap contact, and an auxiliary drain spherical ink cap contact adjacent to the drain spherical ink cap contact;

wherein printing the source metal ink line includes printing the source metal ink line at least partially overlying both the source spherical ink cap contact and auxiliary source spherical ink cap contact; and, wherein printing the drain metal ink line includes printing the drain metal ink line at least partially overlying both the drain spherical ink cap contact and auxiliary drain spherical ink cap contact.

12. The method of claim 11 wherein continuously printing metal ink across the region of the substrate top surface includes printing in a first plurality of adjacent iterations separated by a third distance;

wherein forming the spherical ink cap contacts in the file includes forming a first plurality of adjacent files, where each file includes a source spherical ink cap contact, auxiliary source spherical ink cap contact, drain spherical ink cap contact, and auxiliary drain spherical ink cap contact;

wherein printing the source metal ink line includes printing the source metal ink line at least partially overlying both the source spherical ink cap contact and auxiliary source spherical ink cap contact in each file; and, wherein printing the drain metal ink line includes printing the drain metal ink line at least partially overlying both the drain spherical ink cap contact and auxiliary drain spherical ink cap contact in each file.

13. The method of claim 12 wherein forming the spherical ink cap contacts into the first plurality of files includes forming n files; and, wherein forming the completed TFT includes forming the TFT having a channel length equal to the first distance and a channel width equal to (n×the third distance).

14. The method of claim 6 wherein forming the source metal ink line and drain metal ink line separated by the second distance includes the second distance being equal to a minimum movement of the printer device.

* * * * *